United States Patent [19]

Akaoka

[11] 4,090,983
[45] May 23, 1978

[54] PHOTOCONDUCTIVE CADMIUM SULFIDE AND PROCESS FOR PRODUCING SAME

[75] Inventor: Teruhisa Akaoka, Yokohama, Japan

[73] Assignee: KIP Corporation, Tokyo, Japan

[21] Appl. No.: 736,502

[22] Filed: Oct. 28, 1976

[30] Foreign Application Priority Data

Nov. 6, 1975 Japan ................... 50-133405

[51] Int. Cl.² ............................................. H01C 31/00
[52] U.S. Cl. ................................ 252/501; 96/1.5 R; 252/518; 423/561 B; 106/301
[58] Field of Search .................. 252/501; 96/1.5; 423/561 B, 565; 106/301

[56] References Cited

U.S. PATENT DOCUMENTS

| | | | |
|---|---|---|---|
| 3,573,905 | 4/1971 | Makino et al. | 252/501 X |
| 3,595,646 | 7/1971 | Kinoshita | 252/518 X |
| 3,694,201 | 9/1972 | Behringer | 252/501 X |
| 3,743,609 | 7/1973 | Hirata et al. | 423/561 B X |
| 3,895,943 | 7/1975 | Hanada et al. | 252/501 X |

Primary Examiner—Benjamin R. Padgett
Assistant Examiner—E. Suzanne Parr
Attorney, Agent, or Firm—Cushman, Darby & Cushman

[57] ABSTRACT

Photoconductive cadmium sulfide of high photosensitivity suitable for use in electrophotography. Such photoconductive cadmium sulfide is produced by subjecting cadmium sulfide powder to a heat treatment conducted at a temperature ranging from 200° to 600° C in an oxygen-containing inert gas atmosphere, incorporating the treated cadmium sulfide powder with a flux, an activator and sulfur in an amount of 0.002–0.05% by weight based on the cadmium sulfide powder and then baking the mixture in an inert gas atmosphere.

10 Claims, 1 Drawing Figure

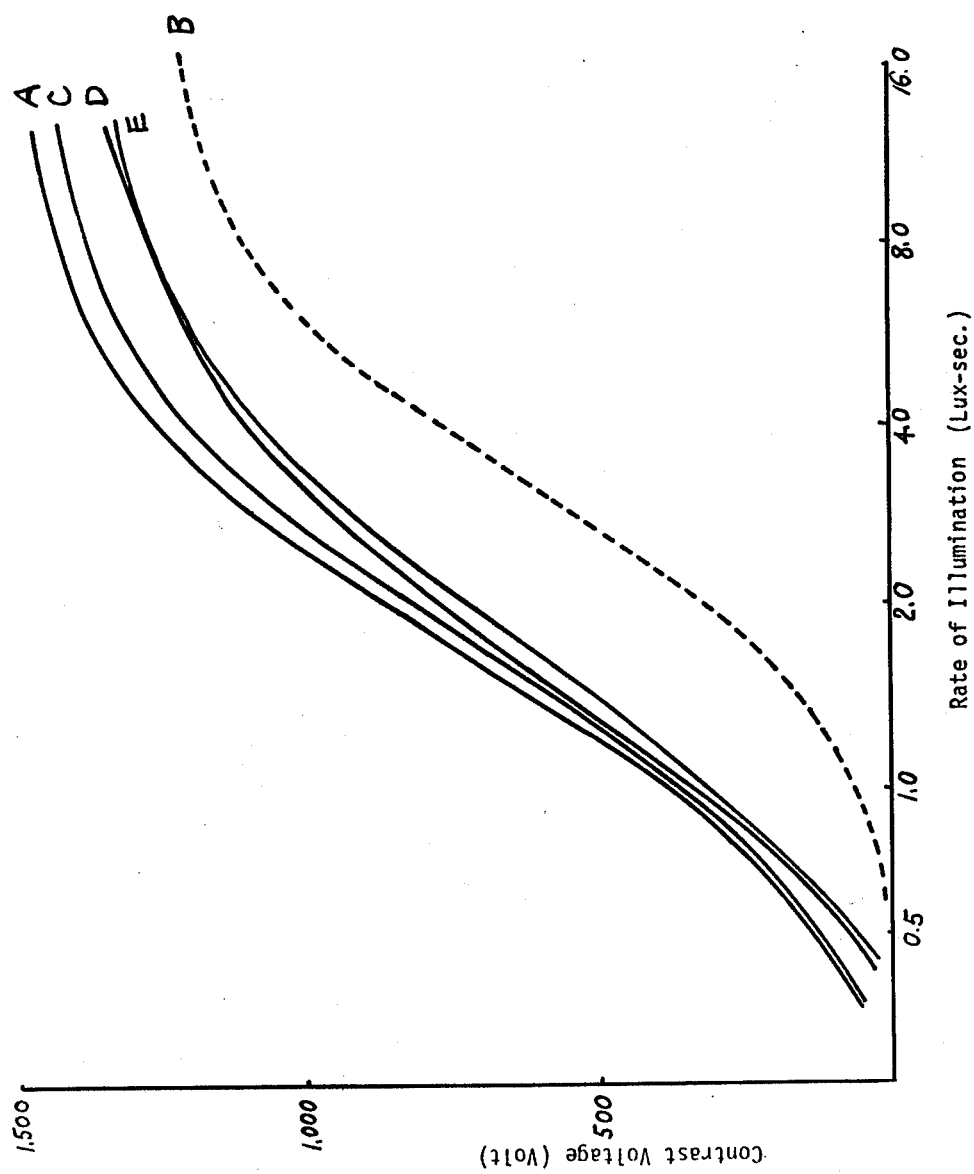

PHOTOCONDUCTIVE CADMIUM SULFIDE AND PROCESS FOR PRODUCING SAME

BACKGROUND OF THE INVENTION

This invention relates to a novel process for the production of photoconductive cadmium sulfide powder suitable for use in electrophotographic materials. More particularly, this invention relates to a process for the production of photoconductive cadmium sulfide powder of high quality by a one-step baking treatment wherein cadmium sulfide powder obtained by such a method as a precipitation method is used as raw material.

Photoconductive cadmium sulfide powder is widely used for a photosensitive material for a photosensitive element of electrophotography comprising a substrate with electrode function coated with a layer of such cadmium sulfide powder having a thickness of several ten microns by the aid of a binder such as a synthetic resin and overcoated with a top layer of a transparent high insulating material.

The photoconductive cadmium sulfide has hitherto been prepared by either the two-step baking method wherein cadmium sulfide incorporated with a flux and an activator is baked in the first baking step and the product is pulverized, washed with water and then baked in a sulfur-containing atmosphere in the second baking step or the three-step baking method wherein the first baking step is further divided into two steps. Because of a number of steps involved, however, these methods have many drawbacks including fluctuation in quality of the resulting photoconductive cadmium sulfide and reduction in yield of the product, thus resulting in increase of cost. In particular, the pulverization step carried out between the first and second baking steps or between two second and third baking steps creates a primary cause of the undue fluctuation in quality of the product, since such pulverization step serves also to deform the crystals once formed and fails to reproduce a narrow definite distribution range of particle sizes, thus exerting significant influence on photoconductivity. For obtaining photoconductive cadium sulfide of high sensitivity, the baking and other treatments should adequately be controlled so that the so-called dark resistance of cadmium sulfide may fall within a suitable range which is not too high nor too low. However, the prior art methods consisting of a number of steps are not only difficult in control of conditions adopted therein but also abundant in uncontrollable factors such as the pulverization step referred to above. In the prior art methods, therefore, there has often been observed the case wherein the dark resistance is not balanced within a suitable range. In the prior art methods, it was necessary to add a relatively large amount, for example, 0.1-2% by weight of sulfur in the final baking step. The existence of such a large amount of sulfur apparently caused reduction in photosensitivity of the product.

The photosensitivity of such a photosensitive element as is described above has a relation with the particle diameter of the cadium sulfide powder as well as the distribution of the particle sizes of the powder, in addition to photoconductivity and dark resistance of cadium sulfide. As a particle diameter of about $2\mu$ and a narrower distribution range were supposed to be preferable, control of such factors was made in the prior art methods by the treatments in the pulverization step and in the decantation step after washing the powder with water. In the prior art methods involving such pulverization and decantation steps, the particle size of the powder is distributed in a wide range and fine particles smaller than $0.5\mu$ in diameter which are said to be undesirable are produced indeed in an amount of about 30%. However, these treatments are inherently difficult to control and thus can hardly be controlled entirely so that reduction in photosensitivity of the product and fluctuation in quality thereof are unavoidable.

In the above situation, there is a great demand for developing cadmium sulfide powder of high photoconductivity which overcomes the above metioned drawbacks and is devoid of any fluctuation in quality as well as a process for producing such excellect cadmium sulfide powder.

BRIEF SUMMARY OF THE INVENTION

Accordingly, it is an object of the present invention to provide photoconductive cadium sulfide powder with high photosensitivity.

It is another object of the present invention to provide photoconductive cadium sulfide powder which is devoid of any fluctuation in quality.

It is still another object of the present invention to provide photoconductive cadmium sulfide powder suitable for use in electrophotography.

It is further object of the present invention to provide a process for the production of photoconductive cadmium sulfide powder with high photosensitivity.

It is still further object of the present invention to provide a process for the production of photoconductive cadmium sulfide powder of high quality by a one-step baking treatment without causing any fluctuation in quality.

Other objects, features and advantages of the present invention will become apparant more fully from the following description of embodiments with reference to the accompanying drawing:

FIG. 1 is a graph showing the electrophotographic characteristics of photosensitive elements including the photoconductive cadmium sulfide produced according to the process of this invention in comparison with those of the photoconductive cadmium sulfide produced according to the prior art method.

DETAILED DESCRIPTION OF THE INVENTION

As a result of extensive researches carried out for developing a process for producing photoconductive cadmium sulfide powder with high photosensitivity which overcomes the drawbacks in the prior art methods and is devoid of any fluctuation in quality, it has now been found that photoconductive cadmium sulfide powder with high photosensitivity is prepared by a single baking treatment from a raw cadium sulfide powder subjected to a specific preliminary treatment without necessity of treatments for pulverization, washing with water and decantation. This invention has been accomplished on the basis of the above finding.

In accordance with the present invention, there is provided a process for the production of photoconductive cadmium sulfide of good quality which comprises subjecting cadmium powder to a heat treatment conducted at a temperature ranging from 200° to 600° C in an oxygen-containing inert gas atmosphere, incorporating the treated cadmium sulfide powder with a flux selected from metal halides, an activator selected from silver salts and copper salts and sulfur in an amount of 0.002–0.05% by weight based on the cadmium sulfide powder, and then baking the mixture in an inert gas atmosphere.

The term "inert gas" is used herein to mean one or more of those gases that should not substantially react with cadmium sulfide directly or indirectly at a temperature up to 800° C, such as nitrogen, helium and argon.

Preferable as cadium sulfide powder used as the raw material for the process of this invention is the one obtained by the precipitation method, which has a high purity of at least 99.9%. Preferably, this material is a powder of 0.4–1.5$\mu$ in average particle size.

Examples of the metal halide used as the flux include cadmium chloride, zinc chloride, potassium chloride, sodium chloride, barium chloride and lithium chloride. Illustrative of the silver and copper salts used as the activator are, for example, silver chloride, cupric chloride cupric sulfate, silver sulfide and cupric sulfide.

In the process of this invention, it is necessary to subject the starting cadmium sulfide powder preliminarily to a given heat treatment. This heat treatment is advantageously carried out by placing the cadmium sulfide in an oxygen-containing inert gas atmosphere maintained at 200°–600° C, preferably 300°–500° C for a period of at least 5 minutes, preferably 10–60 minutes. In this treatment, the oxygen content of the oxygen-containing inert gas atmosphere is preferably within a range of 5–60% by volume. However, the treatment aimed at in this invention can be attained even by use of an inert gas having an oxygen content of less than 5% by volume or more than 60% by volume.

The process of this invention is carried out preferably by adding to the cadmium sulfide treated as above a very small amount of sulfur (0.002–0.05% by weight based on the sulfide), homogeneously blending the mixture with an appropriate amount of the flux and the activator according to a usual method, baking the mixture at a temperature of 550°–800° C for 20–60 minutes in an inert gas such as nitrogen, argon or helium, washing the baked product with water to remove unreacted materials such as the flux and thereafter drying the washed product to obtain the end product. The above-mentioned baking temperature may be varied to some extent depending on the sort and the amount of the flux used.

According to the process of this invention, the amount of sulfur used is very small in comparison with the conventional two-step and three-step baking methods wherein sulfur is used in an amount of 0.1–2% by weight based on the cadmium sulfide used. The use of such a small amount of sulfur makes it possible to improve photosensitivity of the photosensitive element at a low rate of illumination. In order that significantly remarkable improvement in photosensitivity can be attained by the addition of such a very small amount of sulfur quite inconceivable in the prior art methods, it is indispensable to subject the starting cadmium sulfide powder to a preliminary heat treatment conducted in an oxygen-containing inert gas atmosphere prior to the baking treatment. Otherwise, the objects of the present invention can hardly be attained.

According to the process of this invention, the treatments for pulverization and decantation can be omitted and simple heat and one-step baking treatments are only required for achieving the desired effect. As compared with the prior art methods, therefore, the process of this invention is significantly reduced in the number of steps involved and contains none of the steps difficult to control, thus making it possible to obtain the product with a stable quality in a high yield. In the process of this invention wherein the amount of sulfur used is very small as compared with the case of the prior art methods, the photosensitivity value at an illumination in terms of 1 lux-sec. which corresponds to a low rate of illumination in the general field of electrophotography can be increased to 5–6 times as much as the value obtained in the prior art methods. According to the process of this invention involving neither pulverization step nor decantation step, the particle size can satisfactorily be controlled in a simple manner by adjustment of the baking temperature and the amount of the flux, thus bringing about effective concentration of the distribution range of particle sizes sharply to a narrow desired range in average. For example, in the case of controlling the particle diameter of the cadmium sulfide powder to 2.5$\mu$ in average according to the process of this invention, the amount of fine particles of less than 0.5$\mu$ in particle diameter can be reduced to an order of a few percent or less. This merit is indeed surprising if compared with the case of the prior art methods wherein the amount of undesirably fine particles reaches about 30% on account of a combination of the pulverization and decantation steps.

The photoconductive cadmium sulfide obtained as the product of this invention is excellent in photosensitivity and stable in quality and can be used advantageously in the various field of electrophotography according to usual methods.

The present invention will now be illustrated in more detail by way of examples and referential examples.

EXAMPLE 1

200 Grams of cadmium sulfide having a purity of 99.95% were placed in a quartz crucible into which was then introduced a gas mixture comprising nitrogen and 20% by volume of oxygen. The crucible was then placed in an electric furnace and subjected to a heat treatment conducted at 350° C for 40 minutes.

In a container equipped with a stirrer were placed 100 parts by weight of the cadmium sulfide thus treated, 4 parts by weight of potassium chloride, 0.03 part by weight of cupric chloride, 0.02 part by weight of sulfur powder and 100 parts by weight of water. The mixture was dried at 80° C for 4 hours under reduced pressure and transferred into a crucible. Nitrogen gas was introduced into the crucible and the mixture was baked at 700° C for 40 minutes in nitrogen atmosphere. The contents were taken out after cooling, washed thoroughly with deionized water to remove water-soluble ingredients, treated with a sieve of 350 mesh to remove larger particles and dried. Photoconductive cadmium sulfide particles were thus obtained which, in distribution of particle diameters, contained 85% of a fraction between 0.5$\mu$ and 3$\mu$, inclusive, in diameter and 4% of a fraction less than 0.5$\mu$ in diameter.

EXAMPLE 2

200 Grams of cadmium sulfide having a purity of 99.95% were placed in a quartz crucible into which was then introduced nitrogen gas containing 50% by volume of dry air. The cadmium sulfide was subjected to a heat treatment conducted at 400° C for 20 minutes, while passing the gas through the crucible at a flow rate of 0.1l/minute.

To 100 parts by weight of the cadmium sulfide thus heat treated were added one part by weight of cadmium chloride, 0.01 part by weight of cupric chloride, 0.01 part by weight of sulfur and 100 part by weight of water. The mixture was homogeneously mixed in a mixer, dried enough at 80° C under subatmospheric pressure and then placed in a quartz crucible. After introducing nitrogen into the crubible, the mixture was baked at 570° C for 25 minutes. The baked product thus obtained was washed thoroughly with deionized water and dried whereby photoconductive cadmium sulfide was obtained which was 2.8$\mu$ in average particle diameter and contained 56% of a particle fraction between 2$\mu$ and 3$\mu$ in diameter, 35% of a particle fraction between 3$\mu$ and 4$\mu$ in diameter and 5% of a particle fraction less than 1$\mu$ in diameter.

For the purpose of comparison, cadmium sulfide of high purity was subjected to a baking treatment according to the conventional two-step baking treatment (Example 1 of U.S. Pat. No. 3,595,646 referred to) without being subjected to a preliminary heat treatment as described above. The resulting photoconductive cadmium sulfide was decanted 40 times. In this case, a particle fraction less than 0.5$\mu$ in diameter which flowed out during the decantation treatment was 30% based on the total amount. The product retained after the decantation treatment had a particle diameter of 2.4$\mu$ in average and contained, in distribution of particle diameters, 74% of a fraction between 1$\mu$ and 3$\mu$, inclusive, in diameter and 8% of a fraction less than 1$\mu$ in diameter.

EXAMPLE 3

In a quartz crucible were placed 100 grams of cadmium sulfide. The crucible was then placed in an electric furnace and the cadmium sulfide was subjected to a heat treatment conducted at 400° C for 70 minutes while passing nitrogen containing 1% by volume of oxygen through the crucible at a flow rate of 0.2l/minute.

In a container equipped with a stirrer were placed 100 parts by weight of the cadmium sulfide thus treated, 2 parts by weight of sodium chloride, 0.02 part by weight of cupric chloride, 0.006 part by weight of sulfur powder and 100 parts by weight of water. The mixture was homogeniously mixed, dried at 80° C for 4 hours under reduced pressure and transferred into a crucible. Nitrogen was introduced into the crucible and the contents were baked at 730° C for 50 minutes in nitrogen atmosphere. The contents were taken out after cooling, washed thoroughly with deionized water to remove water-soluble ingredients, treated with a sieve of 350 mesh to remove larger particles and dried. The photoconductive cadmium sulfide thus obtained had a particle diameter of 2.1$\mu$ in average and contained 80% of a particle fraction between 0.5$\mu$ and 3$\mu$, inclusive, in diameter.

EXAMPLE 4

100 Grams of cadmium sulfide were placed in a quartz crucible into which was then introduced a gas mixture comprising nitrogen and 80% by volume of oxygen. The crucible was then placed in an electric furnace and subjected to a heat treatment conducted at 300° C for 50 minutes.

In a container equipped with a stirrer were placed 100 parts by weight of the cadmium sulfide thus treated, 2 parts by weight of sodium chloride, 0.01 part by weight of cupric chloride, 0.01 part of sulfur powder and 100 parts by weight of water. The mixture was thoroughly mixed and dried at 80° C for 5 hours under reduced pressure. The mixture was then placed in a crucible and nitrogen gas was introduced thereinto. The mixture was baked at 750° C for 30 minutes in nitrogen atmosphere. The contents were taken out after cooling, washed thoroughly with deionized water to remove water-soluble ingredients, treated with a sieve of 400 mesh to remove larger particles and dried. The resulting photoconductive cadmium sulfide had a particle diameter of 2.3$\mu$ in average and comprised of 78% of a particle fraction between 1$\mu$ and 3$\mu$, inclusive, in diameter, 11% of a particle fraction larger than 3$\mu$ in diameter and 11% of a particle fraction smaller than 1$\mu$ in diameter.

REFERENTIAL EXAMPLE 1

To 100 parts by weight of the photoconductive cadmium sulfide powder obtained in Example 1 were added 8 parts by weight of vinyl acetate resin as binder. The mixture was dissolved in a mixed solvent of methyl ethyl ketone and acetone and the solution was applied onto an aluminum foil to form thereon a filmy layer of 60$\mu$ in thickness. This filmy layer was overlaid with a film of polyethylene terephthalate of 16$\mu$ in thickness to produce a photosensitive plate of a three layer-laminated structure for use in electrophotography.

Using the photoconductive cadmium sulfide according to the prior art method obtained in the comparative experiment of Example 2, a photosensitive plate of a three layer-laminated structure for use in electrophotography was prepared exactly in the same manner as described above.

The two photosensitive plates were respectively applied to an electrophotographic process comprising a first electrically charging step where the plates were subjected to corona discharge of one polarity, a second step where the plates were subjected to corona discharge of the opposite polarity to the first-mentioned corona discharge and at the same time to the projection of an original light image, and a third step where the plates were irradiated with uniform light, whereby the effect of the present invention was confirmed by examining the characteristics of the electrostatic latent image formed on the photosensitive plates.

The two types of photosensitive plates were subjected to corona discharge of +6000 V followed by a further corona discharge of −6000 V in dark place and then irradiated with uniform light to measure the electric potentials of the photosensitive plates corresponding to the dark area of the light image of the original. The plates were then subjected to corona discharge of +6000 V followed by corona discharge of −6000 V with simultaneous irradiation of uniform light and then further irradiated with uniform light to measure the electric potentials of the photosensitive plates corresponding to the light area of the light image of the original. The difference between two values in electric potential obtained as described above is called contrast voltage and determines the intensity of the electrostatic latent image. The accompanying drawing is a graph showing the relationship between the level of illumination of uniform light irradiated simultaneously with corona discharge of negative polarity and the contrast voltage obtained at that time. In the graph, Curve A shows the result obtained by using the photosensitive plate wherein the CdS powder produced according to Example 1 was used, while Curve B shows the result obtained by using the photosensitive plate wherein the conventional CdS powder was used.

REFERENTIAL EXAMPLE 2

Photosensitive plates for use in electrophotography were produced, using the photoconductive cadmium sulfide powder prepared by the baking treatment according to this invention described in Example 2 [I], the photoconductive cadmium sulfide powder prepared in Example 3 [II] and the photoconductive cadmium sulfide powder prepared in Example 4 [III]. More precisely, 100 parts by weight of the photoconductive cadmium sulfide powder incorporated with 5 parts by weight of a thermoplastic acrylic resin (Type BR-90, manufactured by Mitsubishi Rayon Co., Japan) as binder were dissolved in a mixed solvent of methyl ethyl ketone and cyclohexanone, and the solution was applied onto an aluminum substrate by the doctor blade method to form a photosensitive layer of about 65$\mu$ in thickness on the aluminum substrate. This layer was overlaid with a polyethylene terephthalate film of 16$\mu$ in thickness to produce a photosensitive plate of the three layer-laminated structure for use in electrophotography for each of the three types of the photoconductive cadmium sulfide powder [I], [II] and [III]. The intensity of the electrostatic latent image in each of the three types of photosensitive plates was measured in terms of contrast voltage at various rate of illumination to the electrophotographic process described in Referential Example 1. As a result of measurement, the characterisitics as represented by Curves C, D and E in the graph were shown, Curve C being for the plate including the powder [I], Curve D for the plate including the powder [II] and Curve E for the plate including the powder [III].

As is evident from the accompanying drawing, the photoconductive cadmium sulfide powder of this invention can form electrostatic latent images higher in intensity that those formed by the conventional photoconductive cadmium sulfide powder when applied to the electrophotographic process. Further, the photoconductive cadmium sulfide of this invention is especially remarkable in the effect for improving the sensitivity of photosensitive plates at a low rate of illumination.

It is understood that the preceding representative examples may be varied within the scope of the present specification, both as to ingredients and treatment conditions, by one skilled in the art to achieve essentially the same results.

As many apparently widely different embodiments of this invention may be made without departing from the spirit and scope thereof, it is to be understood that this invention is not limited to the specific embodiments thereof except as defined in the appended claims.

What is claimed is:

1. A process for the production of photoconductive cadmium sulfide which comprises subjecting cadmium sulfide powder to a heat treatment conducted at a temperature ranging from about 200° to about 600° C for at least about 5 minutes in an oxygen-containing inert gas atmosphere, incorporating the treated cadmium sulfide powder with a metal halide flux, an activator selected from the group consisting of sliver salts and copper salts and sulfur in an amount of 0.002–0.05% by weight based on said cadmium powder, and then baking the mixture in an inert gas atmosphere at a temperature ranging from about 550° to about 800° C for a time ranging from about 20 to about 60 minutes.

2. A process according to claim 1 wherein said cadmium sulfide has a high purity of at least 99.9%.

3. A process according to claim 1 wherein said cadmium sulfide is of a powder of 0.4–1.5$\mu$ in average particle size.

4. A process according to claim 1 wherein said flux is a metal chloride.

5. A process according to claim 4 wherein said flux is selected from the group consisting of cadmium chloride, zinc chloride, potassium chloride, sodium chloride, barium chloride and lithium chloride.

6. A process according to claim 1 wherein said activator is selected from the group consisting of silver chloride, cupric chloride, cupric sulfate, silver sulfide and cupric sulfide.

7. A process according to claim 1 wherein the oxygen content of said oxygen-containing inert gas atmosphere is 5–60% by volume.

8. Photoconductive cadmium sulfide produced according to claim 1.

9. A process according to claim 1 wherein the heat treatment is conducted at a temperature ranging from about 300° to about 500° C for a period of from about 10 to about 60 minutes.

10. A process according to claim 1 wherein the inert gas in the baking step is selected from the group consisting of nitrogen, helium and argon.

* * * * *